United States Patent [19]

Kozono

[11] Patent Number: 5,796,160

[45] Date of Patent: Aug. 18, 1998

[54] RESIN-SEALED SEMICONDUCTOR DEVICE

[75] Inventor: Hiroyuki Kozono, Omiya, Japan

[73] Assignee: Kabushiki Kaisha Toshiba, Kawasaki, Japan

[21] Appl. No.: 829,122

[22] Filed: Apr. 10, 1997

[30] Foreign Application Priority Data

Apr. 11, 1996 [JP] Japan .................... 8-089586

[51] Int. Cl.$^6$ .................... H01L 23/10; H01L 23/34
[52] U.S. Cl. .................... 257/675; 257/706; 257/720; 257/796; 361/717; 361/723
[58] Field of Search .................... 257/675, 796, 257/706, 712, 720; 361/717, 718, 719, 723

[56] References Cited

U.S. PATENT DOCUMENTS

| | | | |
|---|---|---|---|
| 4,270,138 | 5/1981 | Desmond | 257/796 |
| 5,172,213 | 12/1992 | Zimmerman | 257/796 |
| 5,227,662 | 7/1993 | Ohno et al. | 257/675 |
| 5,319,242 | 6/1994 | Carney et al. | 257/675 |
| 5,345,106 | 9/1994 | Doering et al. | 257/796 |
| 5,367,196 | 11/1994 | Mahulikar et al. | 257/675 |
| 5,402,006 | 3/1995 | O'Donley | 257/796 |
| 5,444,602 | 8/1995 | Banerjee et al. | 257/675 |
| 5,489,801 | 2/1996 | Blish, II | 257/796 |
| 5,530,295 | 6/1996 | Mehr | 257/675 |
| 5,596,231 | 1/1997 | Combs | 257/796 |
| 5,652,461 | 7/1997 | Ootsuki et al. | 257/675 |

*Primary Examiner*—David Ostrowski
*Attorney, Agent, or Firm*—Finnegan, Henderson, Farabow, Garrett & Dunner, L.L.P.

[57] ABSTRACT

The present invention is provided with a transfer-mold package wherein the surface of a heat sink on which a semiconductor chip dissipating a large amount of heat is formed (the surface does not contact the chip) is exposed from the sealing resin. In this package, a concave portion 16a is formed in the surface of the heat sink to a depth of about 0.1 mm within a range of about 1 mm from the periphery of the heat sink. The concave portion prevents the sealing resin from extending toward the surface of the heat sink at the time of transfer mold, with the result that a resin burr can be prevented from occurring on the periphery of the surface of the heat sink exposed from the sealing resin, and the flatness of the surface of the heat sink can be prevented from being degraded by the resin burr.

4 Claims, 7 Drawing Sheets

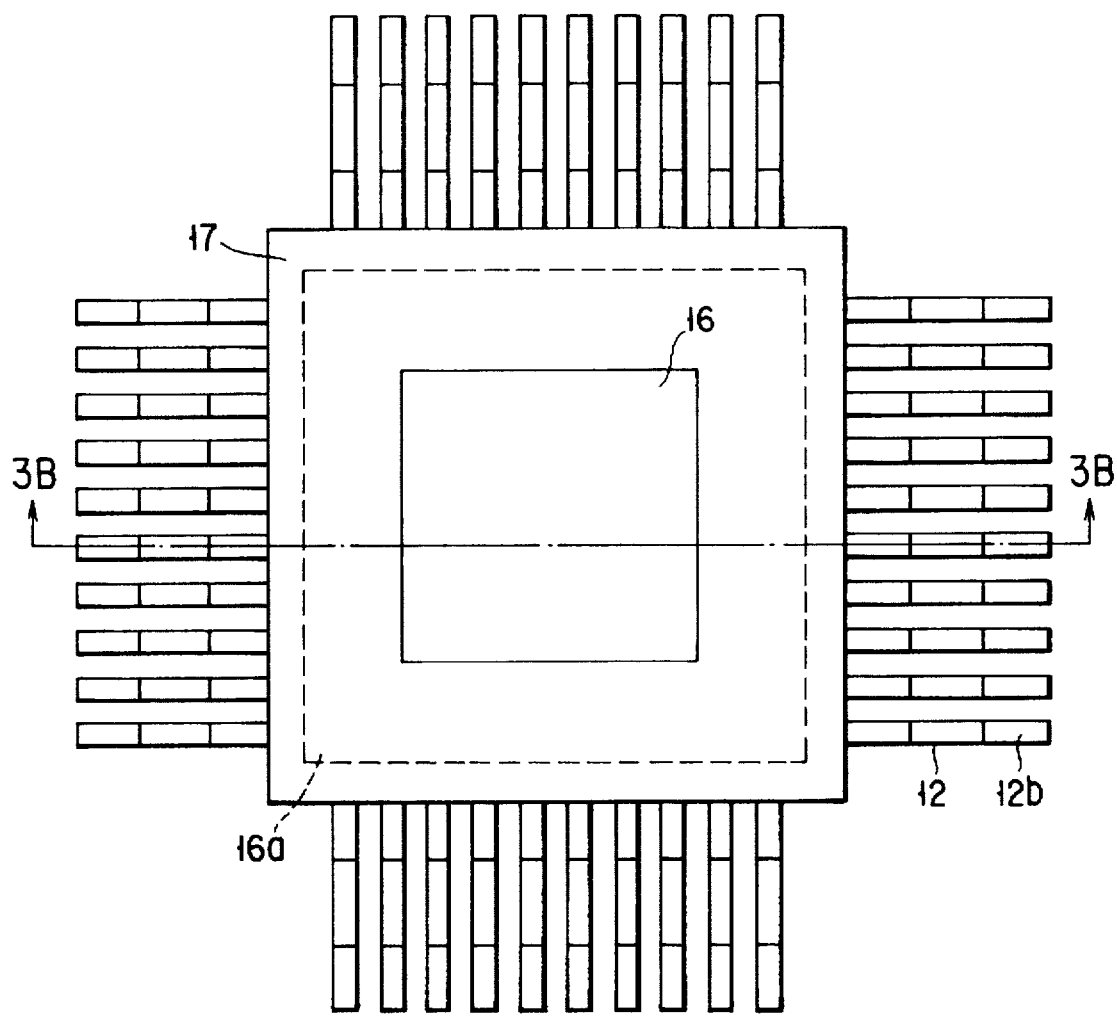
F I G. 3A
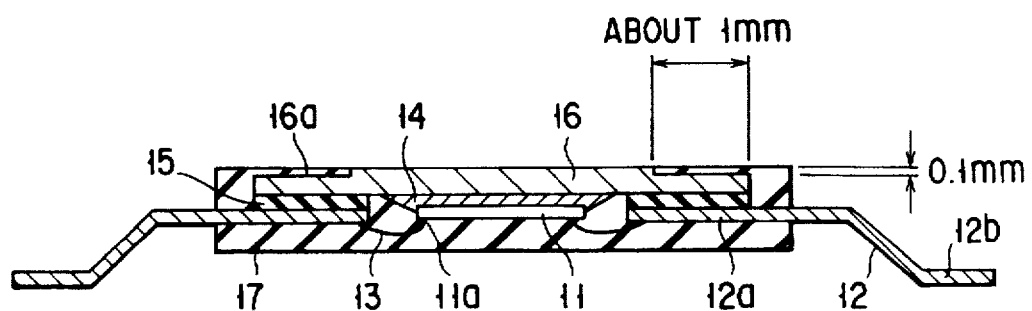
F I G. 3B

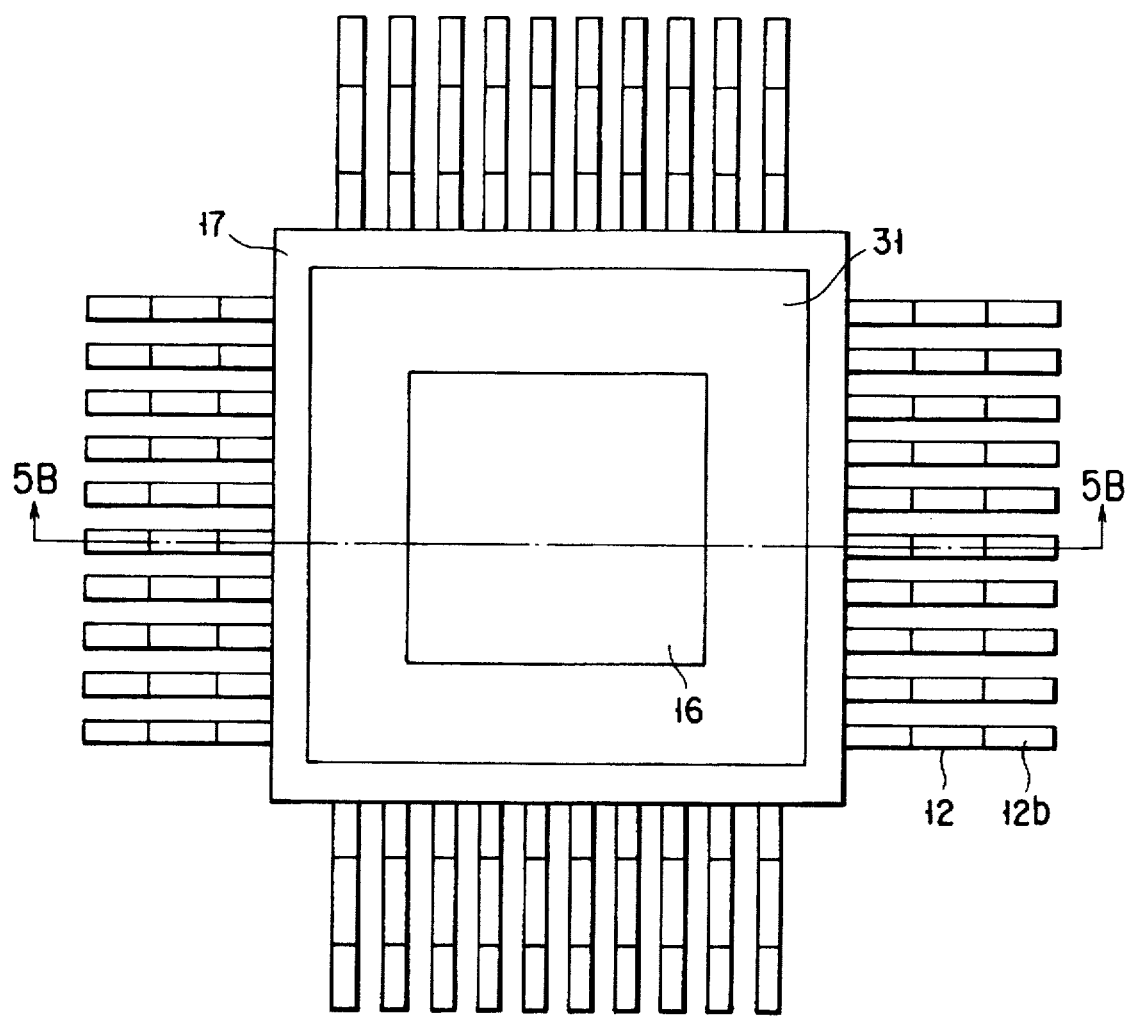
F I G. 5A
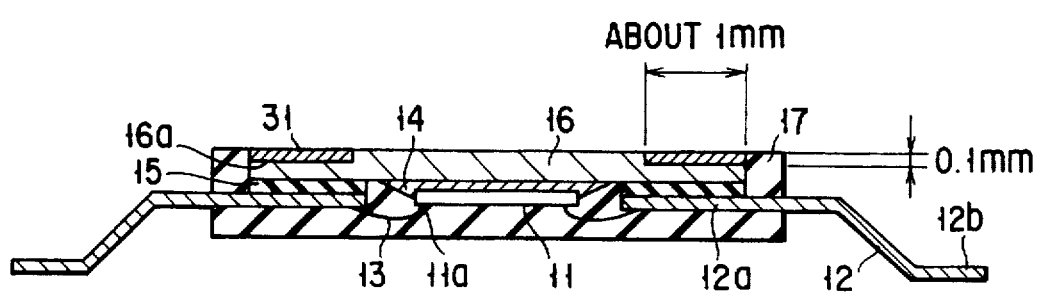
F I G. 5B

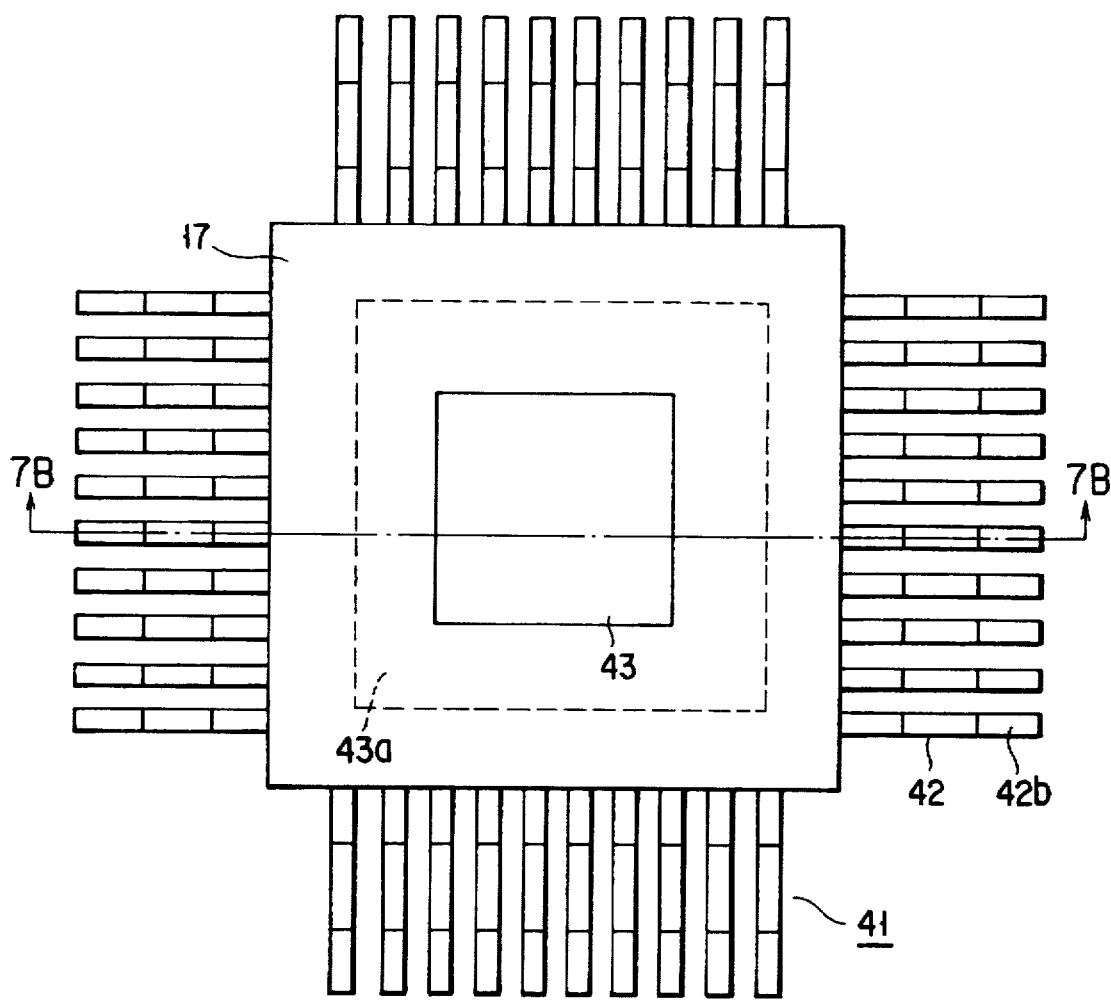
F I G. 7A
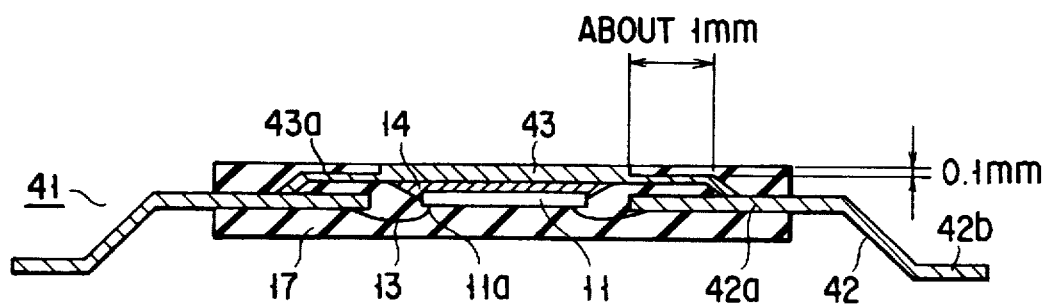
F I G. 7B

1

RESIN-SEALED SEMICONDUCTOR DEVICE

BACKGROUND OF THE INVENTION

The present invention relates to a resin-sealed semiconductor device mounted with an integrated circuit which requires dissipating a large amount of heat and, more specifically, to a transfer-mold package constituted by sealing an integrated circuit with sealing resin such that part of a heat sink onto which the integrated circuit is adhered is exposed from the sealing resin.

A transfer-mold package, which is formed by transfer mold such that part of a heat sink connected to an integrated circuit is exposed from sealing resin, has conventionally been known as a resin-sealed semiconductor device mounted with an integrated circuit which requires dissipating a large amount of heat.

FIGS. 1A and 1B illustrate a prior art transfer-mold package which is so constituted that it can radiate heat. FIG. 1A is a plan view of the package, while FIG. 1B is a cross-sectional view taken along line 1b–1b of FIG. 1A.

As illustrated in FIGS. 1A and 1B, pads 1a are formed on the surface of a semiconductor chip 1 and electrically connected to inner leads 2a of leads 2 of a lead frame by bonding wires 3, respectively. The semiconductor chip 1 is adhered onto a heat sink 6, which is constituted of metal or ceramic and improved in insulation and heat dissipation characteristics, by means of an adhesive 4 such as Ag paste and solder, as are the inner leads 2a by means of an insulative adhesive 5. The surrounding of the semiconductor chip 1, including connecting portions of the inner leads 2a and bonding wires 3, is packaged with sealing resin 7 such as epoxy resin by transfer mold. After the packaging, outer leads 2b of the leads 2 are each separated from the lead frame and formed into a predetermined shape, thus obtaining a transfer-mold package as shown.

The prior art transfer-mold package having the above constitution is favorable for mounting the semiconductor chip 1, which necessitates dissipating a large amount of heat, since the heat of the semiconductor chip 1 is dissipated outside through the heat sink 6. However, as shown in FIGS. 2A and 2B, the prior art package has a drawback in which part of the sealed resin 7 extends toward the surface of the heat sink 6 (which does not contact the chip 1) at the time of transfer mold and is hardened convexly, i.e., a drawback of easily causing a so-called resin burr 8. Though the resin burr 8 is a small one generated within a range of 1 mm or less from the periphery of the heat sink 6 and having a height of 0.1 mm or less, it cannot be easily removed because of good adhesion of the heat sink 6 to the sealed resin 7. For this reason, the flatness of the surface of the heat sink 6 is degraded by the resin burr 8 and the adhesion of the heat sink 6 to a heat dissipating fin is deteriorated, with the result that the resin burr 8 decreases the heat dissipation characteristic of the semiconductor chip.

BRIEF SUMMARY OF THE INVENTION

An object of the present invention is to provide a semiconductor device capable of preventing a resin burr from occurring on the periphery of a heat sink exposed from sealing resin to maintain good adhesion of the heat sink to a heat dissipation fin.

To attain the above object, there is provided a resin-sealed semiconductor device comprising:

a heat sink to which an integrated circuit is connected; and sealing resin for sealing the integrated circuit so as to expose a non-contact surface of the heat sink which does not contact the integrated circuit, wherein a concave portion is formed in a periphery of the non-contact surface of the heat sink.

There is also provided a sealed-resin semiconductor device comprising:

an integrated circuit having a plurality of terminals;

a lead frame having a plurality of leads electrically connected to the terminals of the integrated circuit;

a heat sink to which the integrated circuit is connected;

sealing resin for sealing the integrated circuit so as to expose a non-contact surface of the heat sink which does not contact the integrated circuit; and a concave portion, formed in a periphery of the non-contact surface of the heat sink, for preventing the sealing resin from extending toward the non-contact surface of the heat sink.

According to the above constitution of the resin-sealed semiconductor device, the sealing resin can be prevented from extending toward the periphery of the heat sink. Thus, the flatness of the surface of the heat sink can be prevented from being degraded by the resin burr.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are illustrations of a transfer-mold package according to a first embodiment of the present invention;

FIGS. 5A and 5B are illustrations of a transfer-mold package according to a second embodiment of the present invention;

FIGS. 7A and 7B are illustrations of a transfer-mold package according to a third embodiment of the present invention;

DETAILED DESCRIPTION OF THE INVENTION

Figure 1A:
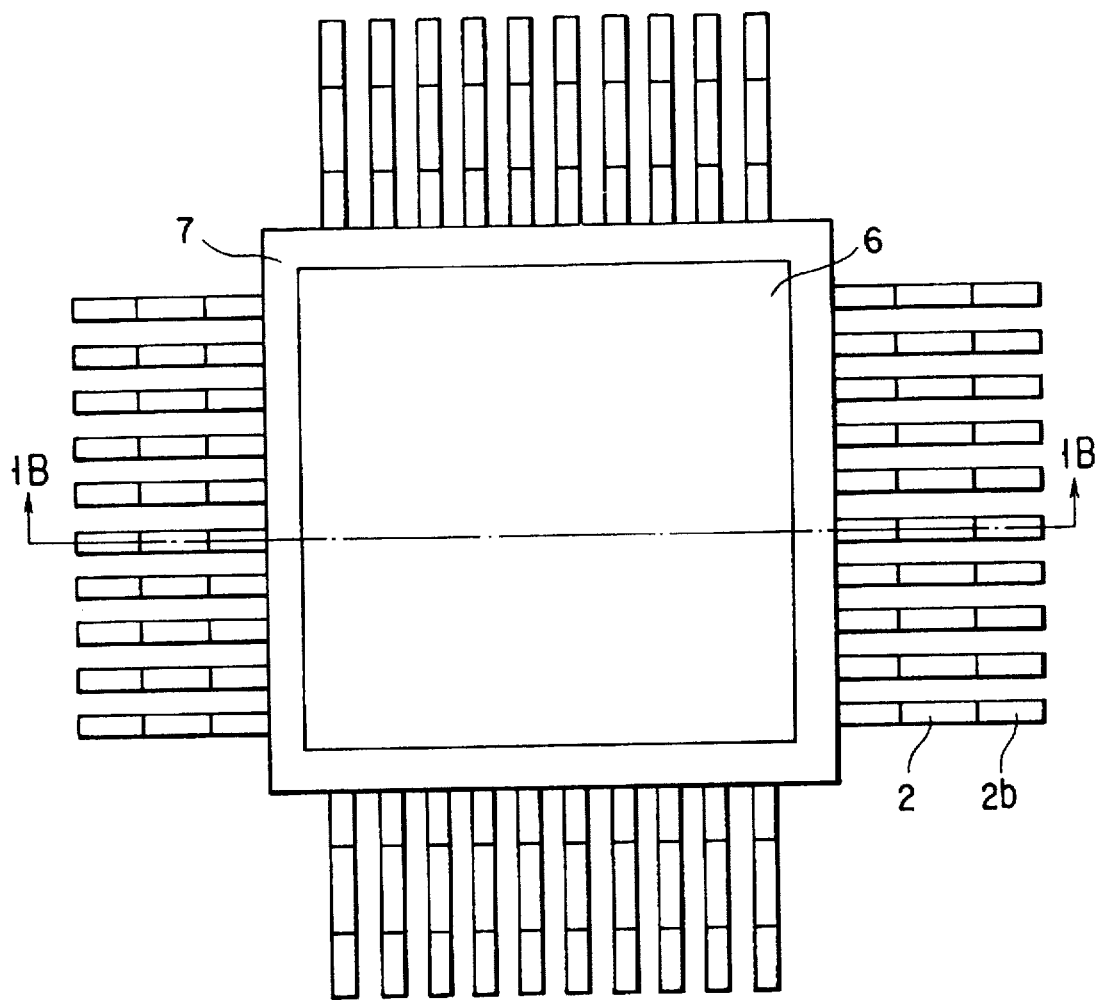
FIGS. 1A and 1B are illustrations of the constitution of a prior art transfer mold package, for explaining its problem.
Figure 1B:
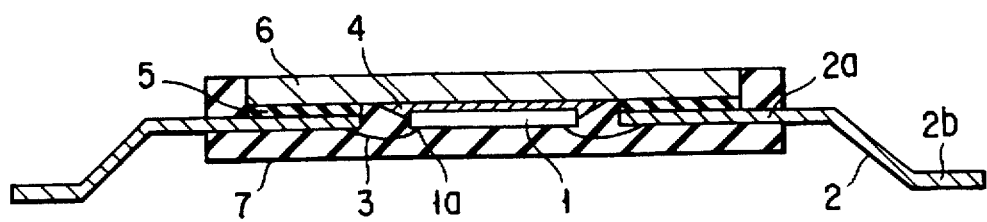
Figure 2A:
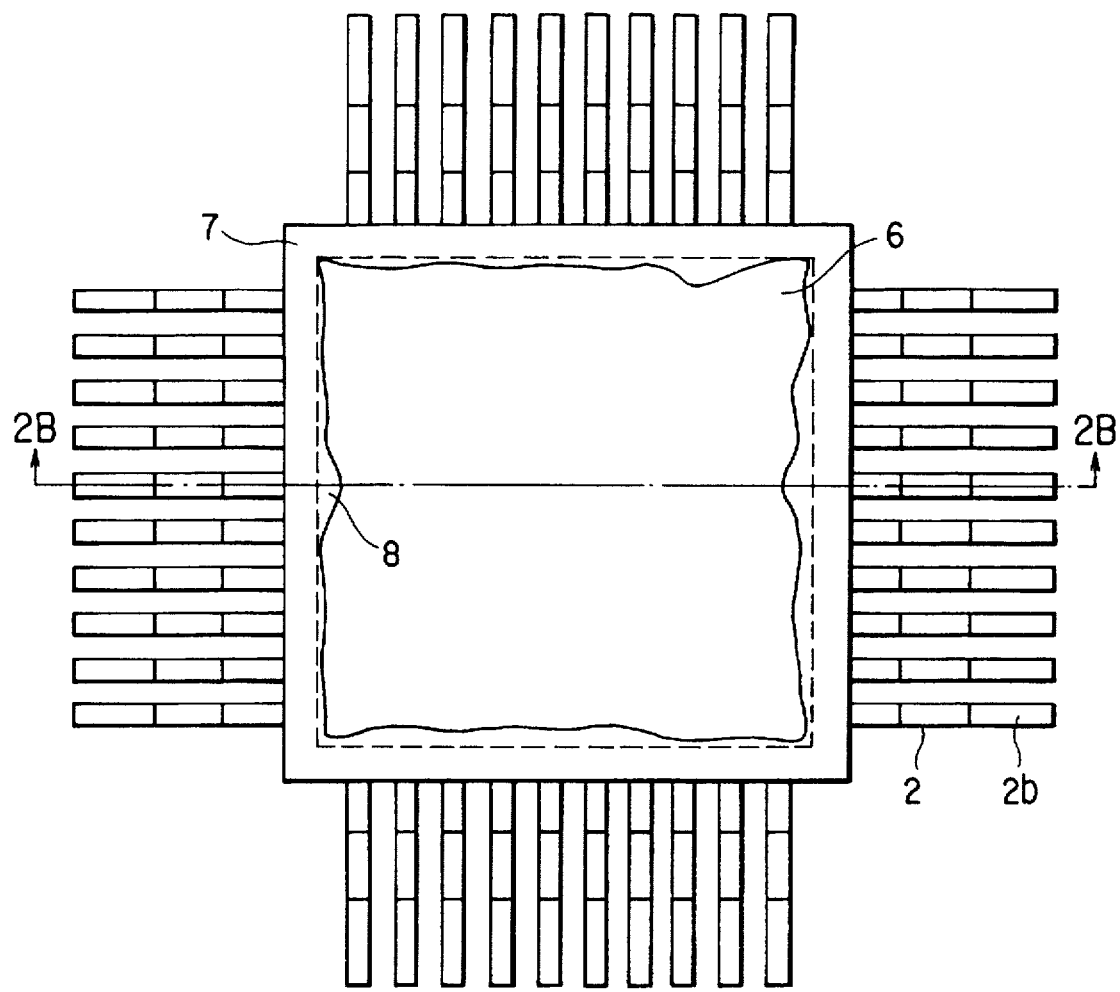
FIGS. 2A and 2B are illustrations of the prior art transfer-mold package in which a resin burr occurs.
Figure 2B:
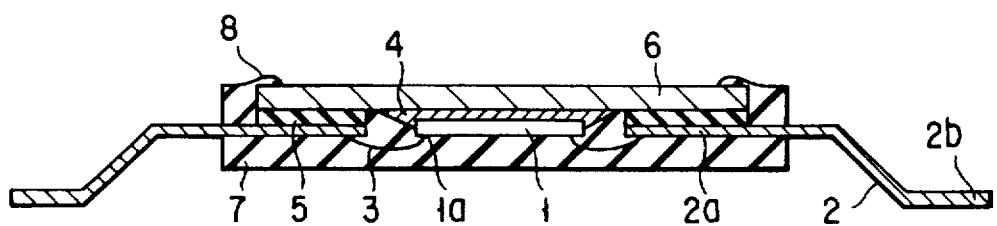

Embodiments of the present invention will now be described with reference to the accompanying drawings.

FIGS. 3A and 3B illustrate the constitution of a transfer-mold package according to a first embodiment of the present invention. FIG. 3A is a plan view of the transfer-mold package, while FIG. 3B is a cross-sectional view taken along line 3b—3b of FIG. 3A.

Pads (terminals) 11a are formed on the surface of a semiconductor chip (integrated circuit) 11 and electrically connected to inner leads 12a of leads 12 of a lead frame by means of bonding wires 13, respectively. The semiconductor chip 11 is connected to a heat sink 16, which is constituted of metal or ceramic and improved in insulation and heat dissipation characteristics by means of an adhesive 14 such as Ag paste and solder, as are the inner leads 12a by means of an insulative adhesive 15. The surrounding of the semiconductor chip 11, including connecting portions of the inner leads 12a and bonding wires 13, is packaged with sealing resin 17 such as epoxy resin by transfer mold. After the packaging, outer leads 12b of the leads 12 are each separated from the lead frame and formed into a predetermined shape, thus obtaining a transfer-mold package as shown.

The heat sink 16 has a concave portion 16a on its periphery which does not contact the semiconductor chip 11, and the width of the concave portion 16a is about 1 mm and the depth thereof is about 0.1 mm. Since the concave portion 16a considerably prevents the sealing resin 17 from extending toward the surface of the heat sink 16 at the time of transfer mold, a resin burr can be prevented from occurring on the periphery of the surface of the heat sink 16 exposed from the sealing resin 17. The degradation in the flatness of the surface of the heat sink 16, which is due to the resin burr, can thus be prevented.

The above constitution of the transfer mold package can prevent the resin burr from occurring and easily maintain the flatness of the surface of the heat sink 16 without degrading the adhesion of the heat sink 16 and sealing resin 17. Consequently, the adhesion of the heat sink 16 to the dissipating fin can be improved, and high dissipation characteristics can be secured.

Since the sealing resin 17 confined in the concave portion 16a is as thin as 0.1 mm or less, the heat dissipation effect can sufficiently be obtained. In other words, the amount of sealing resin 17 extending toward the surface of the heat sink 16 is very small, and even the concave portion 16a of about 0.1 mm in depth can considerably prevent a resin burr from occurring. If, therefore, the concave portion 16a is reduced in depth and the sealing resin 17 therein is thinned, heat is dissipated from the concave portion 16a through the sealing resin 17. Even though that surface of the heat sink 16 which is exposed from the sealing resin 17 is somewhat decreased due to the concave portion 16a, the heat dissipation characteristics are not lowered so greatly, rather, considerably high heat dissipation characteristics can be secured.

Figure 4:
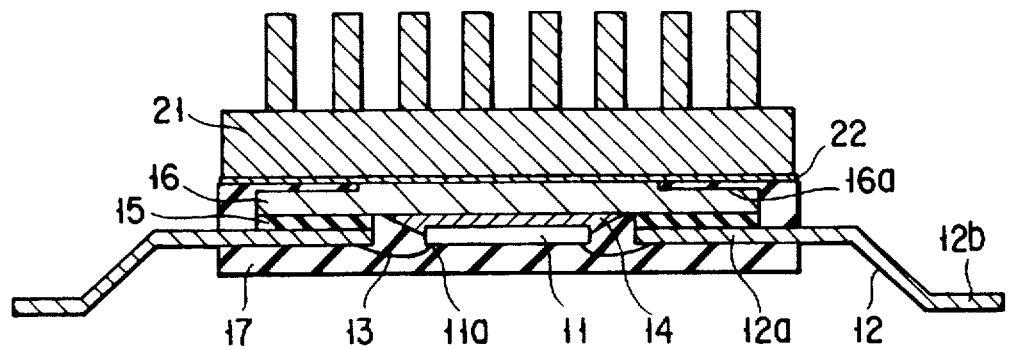
FIG. 4 is a cross-sectional view of the transfer-mold package of FIGS. 3A and 3B on which a heat dissipation fan is mounted.

FIG. 4 is a cross-sectional view of the foregoing transfer-mold package on which a heat dissipation fin 21 is mounted. For example, the dissipation fin 21 is mounted on the top of the package, i.e., on the surface of the heat sink 16, which is exposed from the sealing resin 17, by means of an adhesive 22. In this case, no resin burr occurs on the periphery of the surface of the heat sink 16 and, in other words, the flatness of the surface of the heat sink 16 is secured, thus maintaining good adhesion between the heat sink 16 and heat dissipation fin 21. Even when the fin 21 is mounted, the adhesion between the plate 16 and fin 21 can be improved and the high heat dissipation characteristics can be secured.

As described above, a resin burr can be prevented from occurring on the periphery of the heat sink exposed from the sealing resin and, in other words, the concave portion is formed on the periphery of the surface of the heat sink, which does not contact the semiconductor chip. It is thus possible to prevent the flatness of the surface of the heat sink from deteriorating, thus improving the adhesion of the heat sink to the heat dissipation fin and maintaining high heat dissipation characteristics.

In the foregoing first embodiment, the concave portion is formed on the periphery of the surface of the heat sink to prevent the sealing resin from extending toward the surface of the heat sink at the time of transfer mold. For example, the concave portion can be plated.

FIGS. 5A and 5B illustrate the constitution of a transfer-mold package according to a second embodiment of the present invention. FIG. 5A is a plan view of the package, while FIG. 5B is a cross-sectional view taken along line 5b—5b of FIG. 5A.

Pads 11a are formed on the surface of a semiconductor chip 11 and electrically connected to inner leads 12a of leads 12 of a lead frame by means of bonding wires 13, respectively. The semiconductor chip 11 is connected to a heat sink 16, which is constituted of metal or ceramic and improved in insulation and heat dissipation characteristics by means of an adhesive 14 such as Ag paste and solder, as are the inner leads 12a by means of an insulative adhesive 15. The surrounding of the semiconductor chip 11, including connecting portions of the inner leads 12a and bonding wires 13, is packaged with sealing resin 17 such as epoxy resin by transfer mold. After the packaging, outer leads 12b of the leads 12 are each separated from the lead frame and formed into a predetermined shape, thus obtaining a transfer-mold package as shown.

The heat sink 16 has a concave portion 16a on its periphery which does not contact the semiconductor chip 11, and the width of the concave portion 16a is about 1 mm and the depth thereof is about 0.1 mm. A plating layer 31 of silver, palladium or the like is formed in the concave portion 16a. Since the adhesion of the plating layer 31 and sealing resin 17 is poor or poorer than that of the heat sink 16 and sealing resin 17, even though the sealing resin 17 extends toward the surface of the heat sink 16 at the time of transfer mold to cause a resin burr on the periphery of the surface of the heat sink 16 exposed from the sealing resin 17, the resin burr can easily be eliminated afterward.

Figure 6:
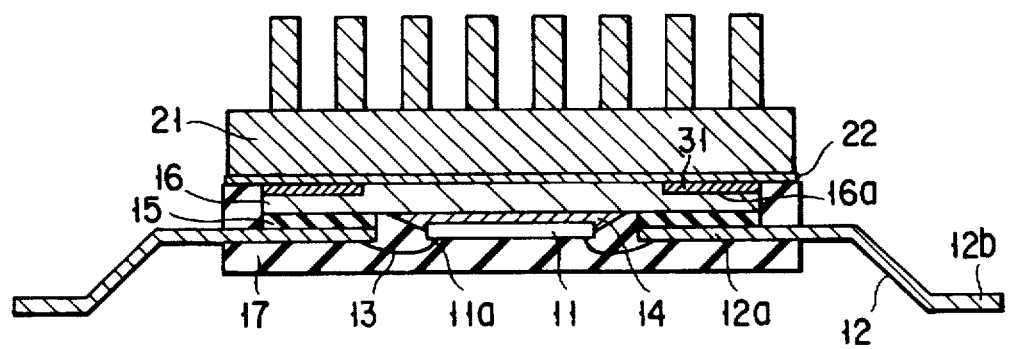
FIG. 6 is a cross-sectional view of the transfer-mold package of FIGS. 5A and 5B to which a heat dissipation fan is mounted.

The above constitution of the second embodiment prevents the flatness of the surface of the heat sink 16 from deteriorating, as does that of the first embodiment. Therefore, as shown in FIG. 6, even when a heat dissipation fin 21 is mounted on the surface of the heat sink 16 with an adhesive 22, the adhesion of plate 16 and fin 21 can be improved and high heat dissipation characteristics can be secured.

In both the first and second embodiments, an exclusive heat sink is employed. However, a bed of the lead frame mounted with the semiconductor chip can be used as a sink plate.

FIGS. 7A and 7B illustrate a transfer-mold package according to a third embodiment of the present invention which is so constituted that a bed of a lead frame serves as a heat sink. FIG. 7A is a plan view of the package, while FIG. 7B is a cross-sectional view taken along line 7b—7b of FIG. 7A.

Pads 11a are formed on the surface of a semiconductor chip 11 and electrically connected to inner leads 42a of leads 42 of the lead frame 41 by means of bonding wires 13, respectively. The semiconductor chip 11 is mounted on the bed 43 of the lead frame 41 and connected thereto by means of an adhesive 14 such as Ag paste and solder. The surrounding of the semiconductor chip 11, including connecting portions of the inner leads 42a and bonding wires 13, is packaged with sealing resin 17 such as epoxy resin by transfer mold, so as to expose the surface of the bed 43 which does not contact the semiconductor chip 11. After the packaging, outer leads 42b of the leads 12 are each separated from the lead frame 41 and formed into a predetermined shape, thus obtaining a transfer-mold package as shown.

The bed 43 has a concave portion 43a on its periphery which does not contact the semiconductor chip 11, and the width of the concave portion 16a is about 1 mm and the depth thereof is about 0.1 mm. Since the concave portion 43a considerably prevents the sealing resin 17 from extending toward the surface of the bed 43 at the time of transfer mold, a resin burr can be prevented from occurring on the periphery of the surface of the heat sink 16 exposed from the sealing resin 17. The degradation in the flatness of the surface of the bed 43, which is due to the resin burr, can thus be prevented.

The above constitution of the third embodiment prevents the flatness of the surface of the bed 43 serving as a heat sink from deteriorating, as does that of the first embodiment. Therefore, even when a heat dissipation fin is mounted (not shown), the adhesion of the fin and bed 43 can be improved and high heat dissipation characteristics can be secured.

Furthermore, in the transfer-mold package of the third embodiment, a resin burr can be prevented from occurring by forming a plating layer in a concave portion 43a of the bed 43, as in the case of the second embodiment.

Figure 8A:
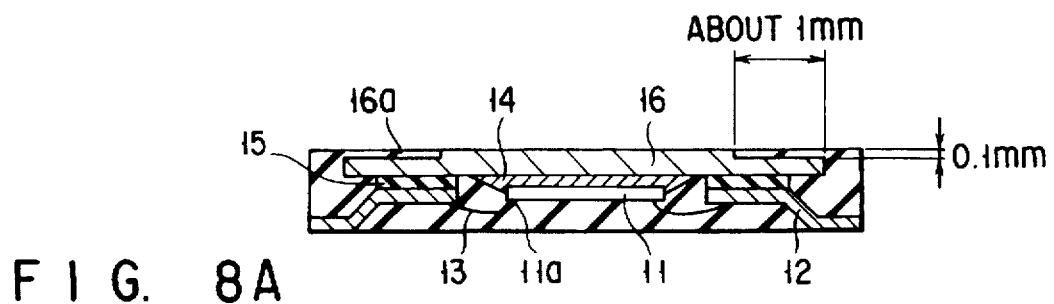
FIGS. 8A and 8B are cross-sectional views of a transfer-mold package according to a fourth embodiment of the present invention.
Figure 8B:
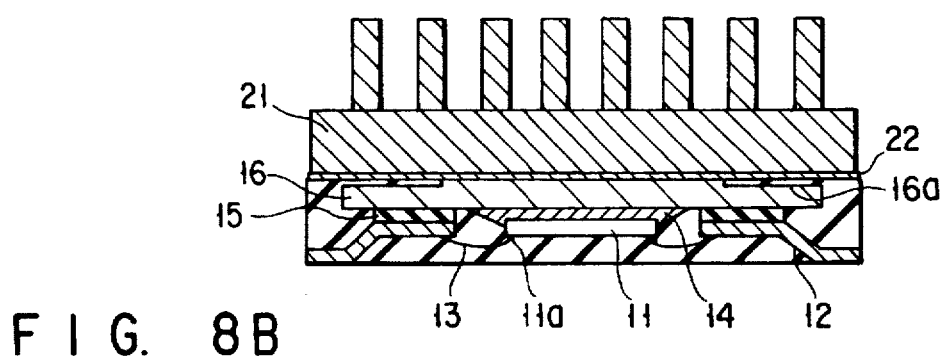

FIGS. 8A and 8B illustrate a transfer-mold package according to a fourth embodiment of the present invention, which is applied to an SON (small outline non-lead) package. FIG. 8A is a plan view of the package, while FIG. 8B is a cross-sectional view illustrating a heat dissipation fin mounted on the package.

As shown in FIG. 8A, pads 11a are formed on the surface of a semiconductor chip 11 and electrically connected to the inner leads of leads 12 of a lead frame by means of bonding wires 13, respectively. The semiconductor chip 11 is connected to a heat sink 16, which is constituted of metal or ceramic and improved in insulation and heat dissipation characteristics by means of an adhesive 14 such as Ag paste and solder, as are the inner leads of the leads 12 by means of an insulative adhesive 15. The surrounding of the semiconductor chip 11, including connecting portions of the inner leads and bonding wires 13, is packaged with sealing resin 17 such as epoxy resin by transfer mold. After the packaging, the outer leads of the leads 12 are each formed into a predetermined shape so as to be exposed from the top face (mounting face) of the sealing resin 17, and cut substantially flush with the side of the sealing resin 17, thus obtaining an SON transfer-mold package as shown.

The heat sink 16 has a concave portion 16a on its periphery which does not contact the semiconductor chip 11, and the width of the concave portion 16a is about 1 mm and the depth thereof is about 0.1 mm. Since the concave portion 16a considerably prevents the sealing resin 17 from extending toward the surface of the heat sink 16 at the time of transfer mold, a resin burr can be prevented from occurring on the periphery of the surface of the heat sink 16 exposed from the sealing resin 17. The degradation in the flatness of the surface of the heat sink 16, which is due to the resin burr, can thus be prevented.

The above constitution of the fourth embodiment also allows the entire package to be greatly miniaturized. As illustrated in FIG. 8B, even when a heat dissipation fin 21 is mounted on the surface of the heat sink 16 with an adhesive 22, the adhesion of plate 16 and fin 21 can be improved and high heat dissipation characteristics can be secured, as in the case of the transfer-mold package of the first embodiment.

Figure 9A:
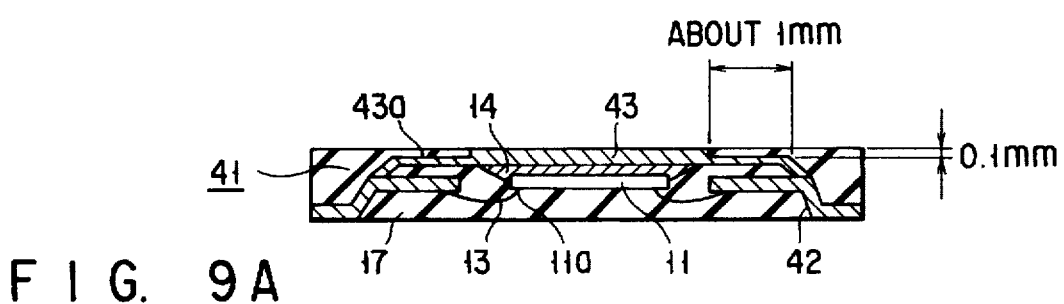
FIGS. 9A and 9B are cross-sectional views of a transfer-mold package according to a fifth embodiment of the present invention.
Figure 9B:
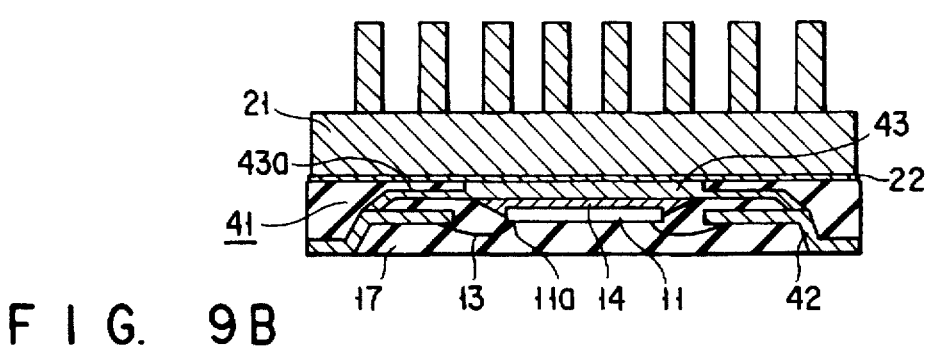

FIGS. 9A and 9B illustrate a transfer-mold package according to a fifth embodiment of the present invention which is so constituted that a bed of a lead frame serves as a heat sink and applied to an SON package. FIG. 9A is a plan view of the package, while FIG. 9B is a cross-sectional view illustrating a heat dissipation fin mounted on the package.

As shown in FIG. 9A, pads 11a are formed on the surface of a semiconductor chip 11 and electrically connected to the inner leads of leads 42 of a lead frame 41 by means of bonding wires 13, respectively. The semiconductor chip 11 is mounted on a bed 43 of the lead frame 41 and connected thereto by means of an adhesive 14 such as Ag paste and solder. The surrounding of the semiconductor chip 11, including connecting portions of the inner leads of the leads 42 and bonding wires 13, is packaged with sealing resin 17 such as epoxy resin by transfer mold, so as to expose the surface of the bed 43 which does not contact the semiconductor chip 11. The outer leads of the leads 12 are each formed into a predetermined shape so as to be exposed from the top face (mounting face) of the sealing resin 17, and cut substantially flush with the side of the sealing resin 17, thus obtaining an SON transfer-mold package as shown.

The bed 43 has a concave portion 43a on its periphery which does not contact the semiconductor chip 11, and the width of the concave portion 16a is about 1 mm and the depth thereof is about 0.1 mm. Since the concave portion 43a considerably prevents the sealing resin 17 from extending toward the surface of the bed 43 at the time of transfer mold, a resin burr can be prevented from occurring on the periphery of the surface of the heat sink 16 exposed from the sealing resin 17. The degradation in the flatness of the surface of the bed 43, which is due to the resin burr, can thus be prevented.

The above constitution of the fifth embodiment also allows the entire package to be greatly miniaturized. As illustrated in FIG. 9B, even when a heat dissipation fin 21 is mounted on the surface of the bed 43 serving as a heat sink by means of an adhesive 22, the adhesion of the fin 21 and bed 43 can be improved and high heat dissipation characteristics can be secured, as in the case of the transfer-mold package of the third embodiment.

All the SON transfer-mold packages shown in FIGS. 8A, 8B, 9A and 9B can prevent a resin burr from occurring even by forming a plating layer in the concave portions 16a and 43a for preventing the sealing resin 17 from expanding, as in the case of the transfer-mold package of the second embodiment.

It is needless to say that various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A resin-sealed semiconductor device comprising:

an integrated circuit having a plurality of terminals;

a lead frame having a plurality of leads electrically connected to the terminals of the integrated circuit;

a heat dissipation plate to which the integrated circuit is connected;

sealing resin for sealing the integrated circuit so as to expose a non-contact surface of the heat dissipation plate, wherein the non-contact surface of the heat dissipation plate does not contact the integrated circuit;

a concave portion formed in a periphery of the non-contact surface of the heat dissipation plate, wherein the concave portion prevents the sealing resin from extending toward the non-contact surface of the heat dissipation plate; and a plating layer imbedded in the concave portion of the heat dissipation plate, wherein the plating layer is the same height as the non-contact surface of the heat dissipation plate, and further wherein the plating layer has poorer adhesion to the sealing resin than the heat dissipation plate has to the sealing resin.

2. The resin-sealed semiconductor device according to claim 1, wherein the concave portion has a depth of about 0.1 mm.

3. The resin-sealed semiconductor device according to claim 1, wherein the plating layer comprises a silver plating film or a palladium plating film.

4. The resin-sealed semiconductor device according to claim 1, wherein the heat dissipation plate also serves as a bed which is uniformly provided together with a lead frame for mounting the integrated circuit.

* * * * *

UNITED STATES PATENT AND TRADEMARK OFFICE
CERTIFICATE OF CORRECTION

PATENT NO. : 5,796,160
DATED : August 18, 1998
INVENTOR(S) : Hiroyuki KOZONO

It is certified that error appears in the above-indentified patent and that said Letters Patent is hereby corrected as shown below:

Claim 1, Col. 7, line 17, "plate:" should read --plate;--.

Signed and Sealed this

Second Day of November, 1999

Attest:

Q. TODD DICKINSON

*Attesting Officer*      *Acting Commissioner of Patents and Trademarks*